(12) United States Patent
Lin et al.

(10) Patent No.: US 10,522,566 B2
(45) Date of Patent: Dec. 31, 2019

(54) TOUCH DISPLAY DEVICE

(71) Applicant: InnoLux Corporation, Miao-Li County (TW)

(72) Inventors: Hsiao-Lang Lin, Miao-Li County (TW); Jui-Jen Yueh, Miao-Li County (TW); Chao-Hsiang Wang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 220 days.

(21) Appl. No.: 15/451,416

(22) Filed: Mar. 7, 2017

(65) Prior Publication Data

US 2018/0157358 A1 Jun. 7, 2018

Related U.S. Application Data

(60) Provisional application No. 62/429,162, filed on Dec. 2, 2016.

(51) Int. Cl.
*G06F 3/041* (2006.01)
*G02F 1/1343* (2006.01)
(Continued)

(52) U.S. Cl.
CPC ........ *H01L 27/1225* (2013.01); *G02F 1/1368* (2013.01); *G02F 1/13338* (2013.01); *G02F 1/133345* (2013.01); *G02F 1/134309* (2013.01); *G06F 3/0412* (2013.01); *H01L 27/124* (2013.01); *H01L 27/1222* (2013.01); *H01L 27/1248* (2013.01); *H01L 27/1251* (2013.01); *H01L 27/1255* (2013.01); *H01L 27/323* (2013.01); *H01L 27/3276* (2013.01); *H01L 29/24* (2013.01); *H01L 29/42356* (2013.01); *H01L 29/7869* (2013.01); *H01L 29/78648* (2013.01); *H01L 29/78675* (2013.01); *H01L 29/78696* (2013.01);
(Continued)

(58) Field of Classification Search
CPC ............. H01L 27/1225; H01L 27/1222; H01L 27/124; H01L 27/1248; H01L 27/1251; H01L 27/1255; G06F 3/0412; G06F 3/044; G06F 3/045; G06F 1/133345; G06F 1/13338; G06F 1/134309; G06F 1/1368; G06F 2001/133388; G06F 2001/13685; G06F 2203/04112
See application file for complete search history.

(56) References Cited

U.S. PATENT DOCUMENTS

2014/0168152 A1* 6/2014 Ishizaki .............. G02F 1/13452
345/174
2015/0212548 A1* 7/2015 Namkung ............. G06F 1/1652
345/174
(Continued)

*Primary Examiner* — Robert J Michaud
(74) *Attorney, Agent, or Firm* — Winston Hsu

(57) ABSTRACT

A touch display device is provided and includes a substrate, a plurality of light-emitting units, and a plurality of touch electrodes. The substrate includes a first edge. The light-emitting units are disposed on the substrate. The touch electrodes are disposed on the light-emitting units. A first distance is a minimum distance from the first edge to the light-emitting units parallel to the substrate, a second distance is a minimum distance from the first edge to the touch electrodes parallel to the substrate, and the first distance is greater than the second distance.

18 Claims, 11 Drawing Sheets

(51) Int. Cl.
*H01L 27/12* (2006.01)
*G02F 1/1333* (2006.01)
*H01L 27/32* (2006.01)
*H01L 29/24* (2006.01)
*H01L 29/423* (2006.01)
*H01L 29/786* (2006.01)
*G02F 1/1368* (2006.01)
*H01L 29/49* (2006.01)

(52) U.S. Cl.
CPC ............. *G02F 2001/13685* (2013.01); *G02F 2001/133388* (2013.01); *H01L 27/3262* (2013.01); *H01L 29/4908* (2013.01); *H01L 29/78672* (2013.01)

(56) References Cited

U.S. PATENT DOCUMENTS

| | | | | |
|---|---|---|---|---|
| 2015/0309600 A1* | 10/2015 | Ramakrishnan | ........ | G06F 3/041 427/108 |
| 2016/0139706 A1* | 5/2016 | Lee | ......... | G06F 3/044 345/174 |

* cited by examiner

TOUCH DISPLAY DEVICE

CROSS REFERENCE TO RELATED APPLICATION

This application claims the benefit of U.S. Provisional Application Ser. No. 62/429,162, filed Dec. 2, 2016.

BACKGROUND OF THE DISCLOSURE

1. Field of the Disclosure

The present disclosure relates to a touch display device, and more particularly to a self-emissive touch display device.

2. Description of the Prior Art

With the advance of the technology of display, touch display devices are becoming more mainstream and commonly applied as input interfaces at external ports of various apparatuses due to integrating touch control and display function. Traditional touch display device is formed by adhering a touch panel to a display panel, in which the touch region of the touch panel for sensing finger touch is usually the same as and conforms the display region of the display panel for displaying image. Since the edges of the touch region are aligned to the edges of the display region, the touch display device at the edges of the display region is not sensitive for the touch of the finger and even delays the response for the touch of the finger. Thus, there is a need for increasing touch sensitivity at the edges of the display region.

SUMMARY OF THE DISCLOSURE

It is therefore one of the objectives of the disclosure to provide a touch display device to increase touch sensitivity at the edges of the display region.

According to an embodiment of the present disclosure, a touch display device is provided. The touch display device includes a substrate, a plurality of light-emitting units, and a plurality of touch electrodes. The substrate includes a first edge. The light-emitting units are disposed on the substrate. The touch electrodes are disposed on the light-emitting units. A first distance is a minimum distance from the first edge to the light-emitting units parallel to the substrate, a second distance is a minimum distance from the first edge to the touch electrodes parallel to the substrate, and the first distance is greater than the second distance.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

It will be understood that when an element is referred to as being "on" another layer or substrate, it can be directly on the other element, or intervening elements may also be present. It will be understood that, although the terms first, second, third etc. may be used herein to describe various light-emitting units, electrodes, regions, wires, strings, edges, distances and/or portions, these light-emitting units, electrodes, regions, wires, strings, edges, distances and/or portions should not be limited by these terms. These terms are used to distinguish one light-emitting unit, electrode, region, wire, string, edge, distance and/or portion from another light-emitting unit, electrode, region, wire, string, edge, distance and/or portion. Thus, a first light-emitting unit, electrode, region, wire, string, edge, distance and/or portion discussed below could be termed a second light-emitting unit, electrode, region, wire, string, edge, distance and/or portion without departing from the teachings of example embodiments. The terms "connection" are not limited to a physical or mechanical connection, and may also comprise electrical connection, whatever direct or indirect.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
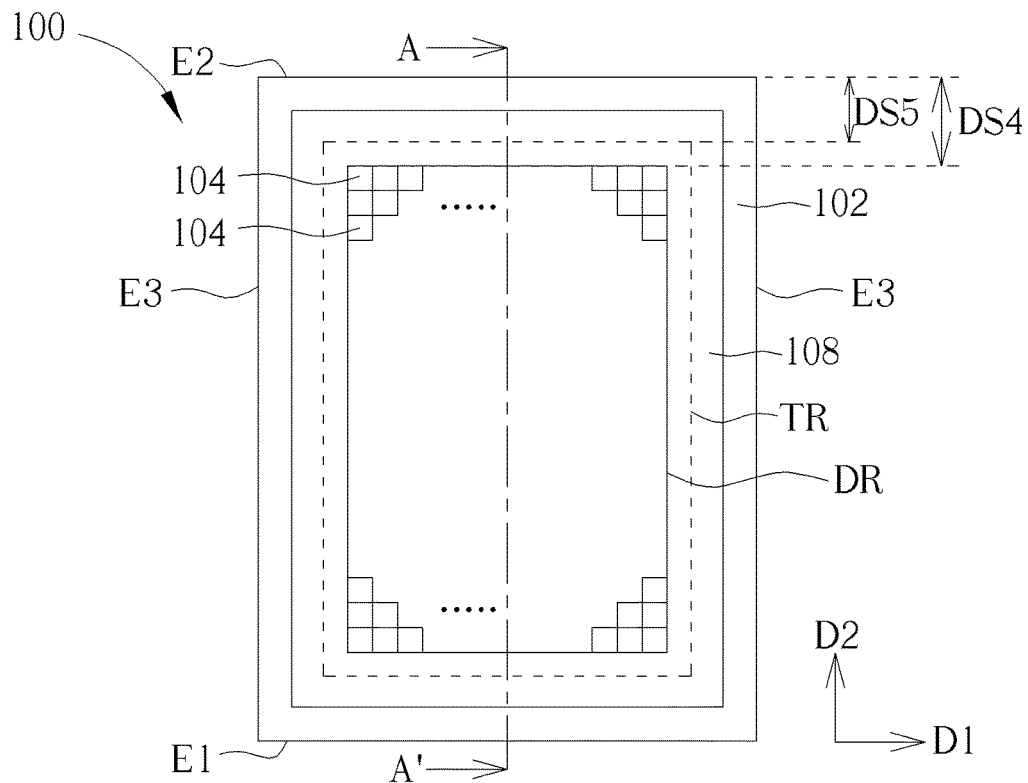
FIG. 1 schematically illustrates a top view of a touch display device according to a first embodiment of the present disclosure.
Figure 2:
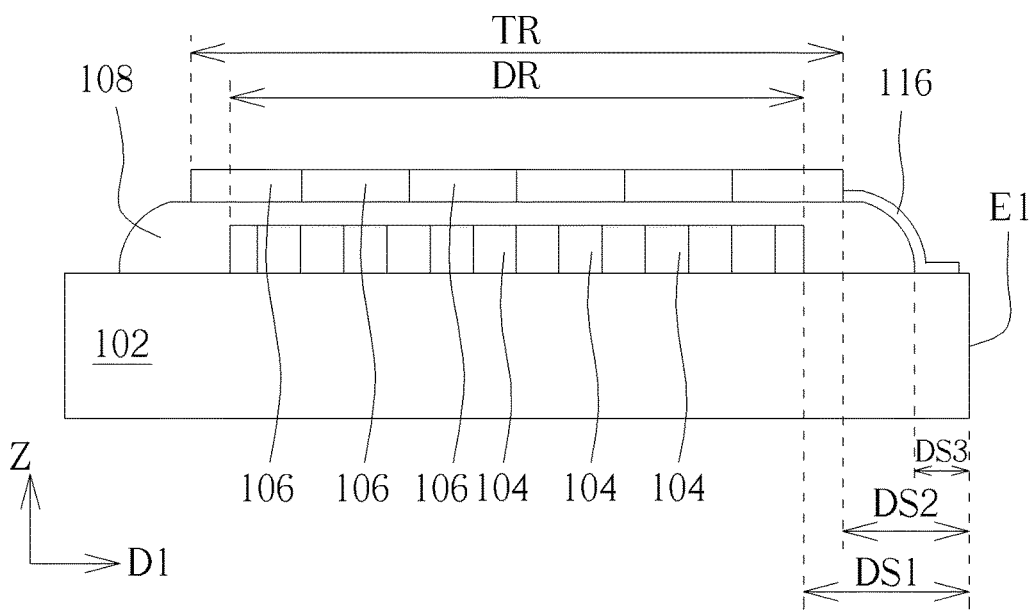
FIG. 2 schematically illustrates a cross-sectional view taken along a cross-sectional line A-A' of FIG. 1.

Refer to FIG. 1 and FIG. 2. FIG. 1 schematically illustrates a top view of a touch display device according to a first embodiment of the present disclosure, and FIG. 2 schematically illustrates a cross-sectional view taken along a cross-sectional line A-A' of FIG. 1. The touch display device 100 includes a substrate 102, a display device layer and a touch device layer. The display device layer used to perform a display function is disposed on the substrate 102 and includes a plurality of light-emitting units 104. Since the light-emitting units 104 can directly generate light to display images, the light-emitting units 104 can define and have a display region DR that substantially has the same size as the image in a vertical direction Z perpendicular to the substrate 102. The touch device layer used to perform a touch-sensing function is disposed on the display device layer and includes a plurality of touch electrodes 106 used to sense touching or approaching of a touch object, such as a finger or a touch pen. Since the touch object is directly sensed by the touch electrodes 106, the touch electrodes 106 can define and have a touch region TR in the vertical direction Z. For clarity, figures omit the devices in the display device layer and the touch device layer except the light-emitting units 104 and the touch electrodes 106, but the present disclosure is not limited thereto.

The substrate 102 may further include, for example, a rigid substrate such as a glass substrate or a quartz substrate, or a flexible substrate such as a plastic substrate, but not limited thereto. In this embodiment, the substrate 102 is used to support the light-emitting units 104 and the touch electrodes 106 formed thereon. The substrate 102 may be, but not limited to, a transparent substrate or an opaque substrate.

In this embodiment, the touch display device 100 may further include an insulation layer 108 disposed between the light-emitting units 104 and the touch electrodes 106. The insulation layer 108 covers the light-emitting units 104 so as to encapsulate the light-emitting units 104. For example, when each light-emitting unit 104 is an organic light-emitting diode, the insulation layer 108 may protect the light-emitting units 104 against moisture and oxygen gas. In this embodiment, the touch electrodes 106 may directly be formed on the insulation layer 108, but not limited thereto. In one embodiment, the touch display device 100 may further include a cover substrate disposed on the touch electrodes 106 to cover and protect the touch electrodes 106, the insulation layer 108 and the light-emitting units 104.

The substrate 102 has a first edge E1. There is a first distance DS1 between the first edge E1 and the light-emitting units 104, and the first distance DS1 is a minimum distance from the first edge E1 to the light-emitting units 104 in a horizontal direction parallel to the substrate 102. In this embodiment, since the first edge E1 is perpendicular to a first direction D1, the horizontal direction may be the first direction D1, but not limited thereto. In another embodiment, the horizontal direction may also be a second direction D2 depending on the extension direction of the first edge E1. Also, there is a second distance DS2 between the first edge E1 and the touch electrodes 106, which is a minimum distance from the first edge E1 to the touch electrodes 106 in the horizontal direction parallel to the substrate 102. The first distance DS1 is greater than the second distance DS2, which means a part of the touch electrodes 106 may exceed an edge of the display region DR defined by the light-emitting units 104, and an edge of the touch region TR can be disposed beyond the edge of the display region DR, so that the touch object can be sensed more accurately when the touch object touches or approaches a region of the touch display device 100 right on the edge of the display region DR. Accordingly, the response to the touching of the touch object can be smooth and sensitive. Furthermore, there is a third distance DS3 between the first edge E1 and the insulation layer 108, and the third distance DS3 is a minimum distance from the first edge E1 to the insulation layer 108 in the horizontal direction parallel to the substrate 102. The third distance DS3 is less than the second distance DS2.

In this embodiment, the substrate 102 may have a second edge E2 opposite to the first edge E1 and two third edges E3 connected to the first edge E1. A fourth distance DS4 is a minimum distance from the second edge E2 to the light-emitting units 104 parallel to the substrate 102, a fifth distance DS5 is a minimum distance from the second edge E2 to the touch electrodes 106 parallel to the substrate 102, and the fourth distance DS4 is greater than the fifth distance DS5. A minimum distance from each third edge E3 to the light-emitting units 104 parallel to the substrate 102 may be also greater than a minimum distance from each third edge E3 to the touch electrodes 106 parallel to the substrate 102. That is to say, a minimum distance from each edge of the substrate 102 to the display region DR formed by the light-emitting units 104 may be greater than a minimum distance from the edge of the substrate 102 to the touch region TR formed by the touch electrodes 106. In other words, each edge of the touch region TR is closer to the corresponding edge of the substrate 102 as compared with the corresponding edge of the display region DR, so that the display region DR is disposed in the touch region TR in the vertical direction Z perpendicular to the substrate 102. The display region DR has a first area in the vertical direction Z, the touch region TR has a second area in the vertical direction Z, and the first area is less than the second area. Accordingly, the touch region TR is greater than the display region DR, thereby mitigating insensitivity or signal delay at the edge of the display region DR or increasing touch sensitivity at the edges of the display region DR. Not all edges of the touch region TR are limited to be closer to the corresponding edge of the substrate 102 as compared with the display region DR in the present closure, and at least one edge of the touch region TR is closer to the corresponding edge of the substrate 102 as compared with the corresponding edge of the display region DR.

Figure 3:
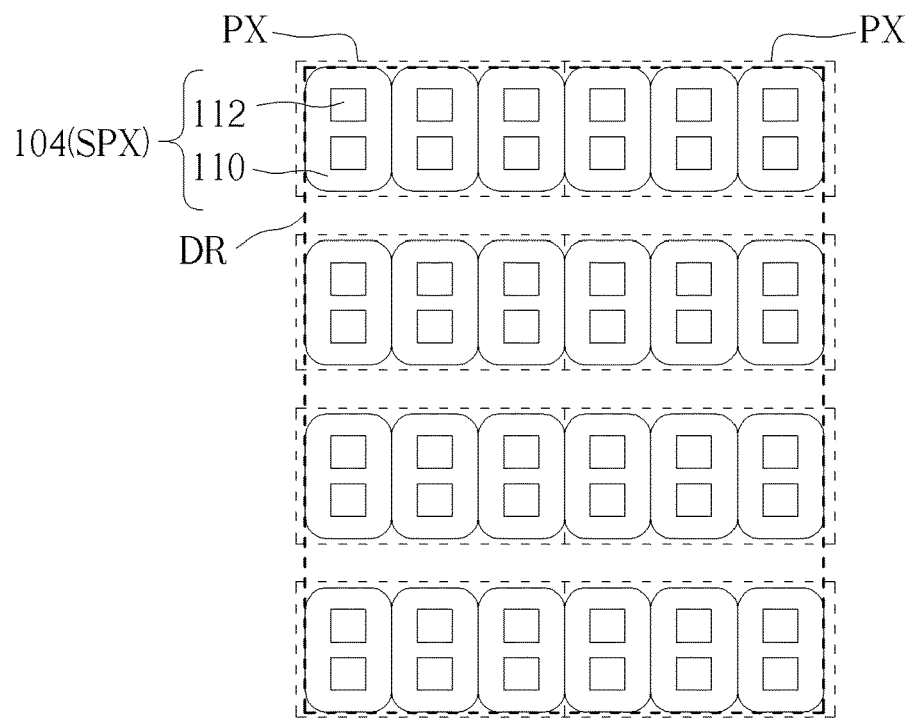
FIG. 3 schematically illustrates a top view of the light-emitting units according to the first embodiment of the present disclosure.

Specifically, as shown in FIG. 3, which schematically illustrates a top view of the light-emitting units according to the first embodiment of the present disclosure, the display device layer may include a plurality of pixels PX for displaying the images. Each pixel PX may be formed of at least three sub-pixels SPX respectively with different colors, for example the sub-pixels SPX may having three primary colors (i.e. R, G and B) respectively, and at least one light-emitting unit 104 for displaying one primary color is disposed in each sub-pixel SPX, but not limited thereto. In this embodiment, each light-emitting unit 104 may include a reflective cup structure 110 and at least one micro light-emitting diode (LED) 112 disposed in the reflective cup structure 110, but not limited thereto. Also, light generated from each micro LED 112 may be reflected by the corresponding reflective cup structure 110, so the light-emitting region generated from each light-emitting unit 104 is about the same as an opening of each reflective cup structure 110. Accordingly, the opening of each reflective cup structure 110 may be defined as the light-emitting region of each light-emitting unit 104 in this embodiment. For example, each opening may be rectangular or other shape, and the reflective cup structures 110 are arranged in a matrix, but not limited thereto. Thus, the display region DR can be defined and formed to be rectangular by connecting the outer ends of the light-emitting regions of the outmost light-emitting units 104, so the display region DR can be a region that the image shows. For example, the outer sides of the light-emitting units 104 closest to the first edge E1 may be connected into one line, and so on. The outer sides of the light-emitting units 104 closest to the four edges of the substrate 102 can form four lines, and the four lines may form the display region DR. The shape of the display region DR is not limited to be rectangular. The outmost end of each outmost light-emitting region may be a point or an edge. In this embodiment, each light-emitting unit 104 may include two micro LEDs 112 disposed in one corresponding reflective cup structure 110, in which one may be used as the main light source, and the other one may be used as a backup, but not limited thereto. The display device layer may further array circuit disposed between the light-emitting units 104 and the substrate 102 for controlling the displaying of the light-emitting units 104 and other devices for displaying, but not limited thereto.

The display device layer is not limited by the aforementioned embodiment, and may have other different variant embodiments. To simplify the description, the identical components in each of the following variant embodiments are marked with identical symbols. The following description will detail the dissimilarities among the first embodiment and the variant embodiments and the identical features will not be redundantly described.

Figure 4:
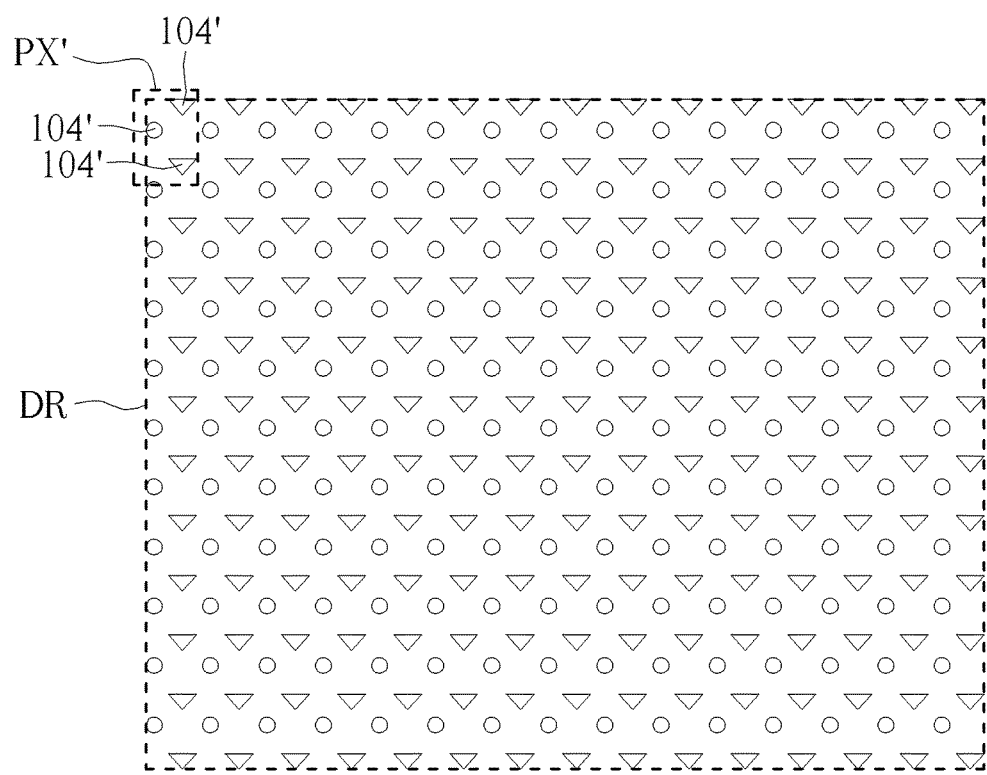
FIG. 4 schematically illustrates a top view of the light-emitting units according to a first variant embodiment of the first embodiment of the present disclosure.

In a first variant embodiment, as shown in FIG. 4, each light-emitting unit 104' may be an organic light-emitting diode, and the light-emitting region of each light-emitting unit 104' is the same as the size of the organic light-emitting diode as compared with the first embodiment. Also, the arrangement of the light-emitting units 104' in each pixel PX' and the shape of each light-emitting region may be different from those in the first embodiment. For example, the arrangement of the light-emitting units 104' in each pixel PX' may be triangle, and each light-emitting region may be triangle or circular, but not limited thereto. In another embodiment, each light-emitting unit 104' may include another kind of self-emissive unit, such as quantum dot material.

Figure 5:
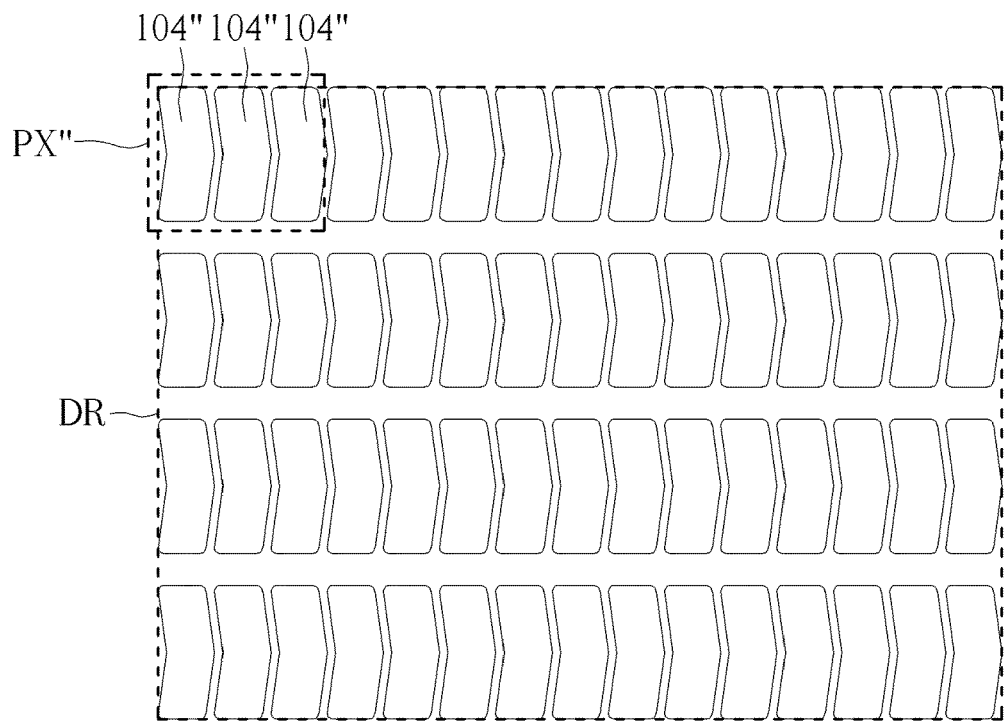
FIG. 5 schematically illustrates a top view of the light-emitting units according to a second variant embodiment of the first embodiment of the present disclosure.

In a second variant embodiment, as shown in FIG. 5, each light-emitting unit 104" may be a sub-pixel of a liquid crystal display instead of being the self-emissive unit. Specifically, the light-emitting region of each light-emitting unit 104" can be an aperture of each sub-pixel. Accordingly, the display region DR may be defined and formed by the outer sides of the apertures of the outmost pixels PX".

Figure 6:
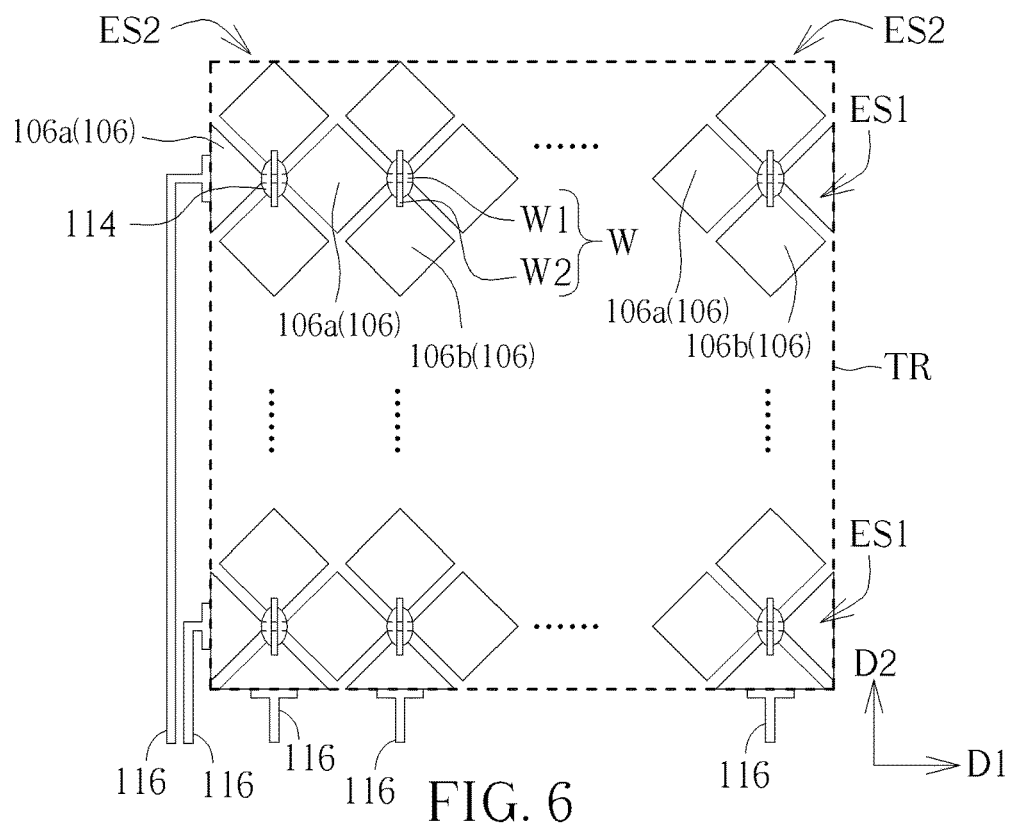
FIG. 6 schematically illustrates a top view of the touch device layer according to the first embodiment of the present disclosure.

With reference to FIG. 6, FIG. 6 schematically illustrates a top view of the touch device layer according to the first embodiment of the present disclosure. In this embodiment, the touch electrodes 106 may be divided into a plurality of first touch electrodes 106a and a plurality of second touch electrodes 106b, and the touch device layer may further include a wire layer W which includes a plurality of first wires W1 and a plurality of second wires W2. Each first wire W1 is disposed between two adjacent first touch electrodes 106a arranged in the first direction D1 respectively and electrically connects them, so that the first touch electrodes 106a and the first wires W1 can form a plurality of first electrode strings ES1 respectively disposed along the first direction D1. Each second wire W2 is disposed between two adjacent second touch electrodes 106b arranged in the second direction D2 respectively and electrically connects them, so that the second touch electrodes 106b and the second wires W2 can form a plurality of second electrode strings ES2 respectively disposed along the second direction D2. The second direction D2 is different from the first direction D1, and may be perpendicular to the first direction D1, but not limited thereto. Accordingly, each first electrode string ES1 may cross each second electrode strings ES2 at crossings of each first wire W1 and the corresponding second wire W2, and the first electrode strings ES1 and the second electrode strings ES2 can sense the position of the touch object. Thus, the touch region TR that can sense the touch object can be defined and formed by connecting the outer ends of the adjacent outmost first touch electrodes 106a of the first electrode strings ES1 and connecting outer ends of the outmost second touch electrodes 106b of the second electrode strings ES2. Since the definition of the touch region TR is similar to that of the display region DR, the definition for the touch region TR will not detailed redundantly. The outmost end of each outmost touch electrode 106 may also be a point or an edge. The touch region TR may be rectangular, but not limited thereto. In this embodiment, the touch electrodes 106 and the first wires W1 are formed of a same conductive layer, and the second wires W2 are formed of another conductive layer. The conductive layers may be formed of transparent conductive material, such as indium tin oxide, conductive clear polymer or antimony tin oxide. The touch display device 100 may further include a plurality of insulation islands 114 respectively disposed between each first wire W1 and the corresponding second wire W2 crossing each other, thereby insulating the first electrode strings ES1 from the second electrode strings ES2.

Refer to FIG. 2 again as well as FIG. 6. The touch device layer may further include a plurality of touch traces 116 electrically connected to the touch electrodes 106 respectively. Specifically, the touch traces 116 are electrically connected to the first electrode strings ES1 and the second electrode strings ES2 respectively. In this embodiment, the touch traces 116 extend from the top surface of the insulation layer 108 to the top surface of the substrate 102 so as to contact the substrate 102 and the insulation layer 108. As the insulation layer 108 covers the light-emitting units 104, a portion of the insulation layer 108 may be disposed between the light-emitting units 104 and the touch traces 116. Also, the touch traces 116 of this embodiment are disposed outside the touch region TR. In another embodiment, one electrode string may be connected to two touch traces 116 at its two ends to reduce resistance between the electrode string and outside control circuit.

The touch device layer is not limited by the aforementioned embodiment, and may have other different variant embodiments. To simplify the description, the identical components in each of the following variant embodiments are marked with identical symbols. The following description will detail the dissimilarities among the first embodiment and the variant embodiments and the identical features will not be redundantly described.

Figure 7:
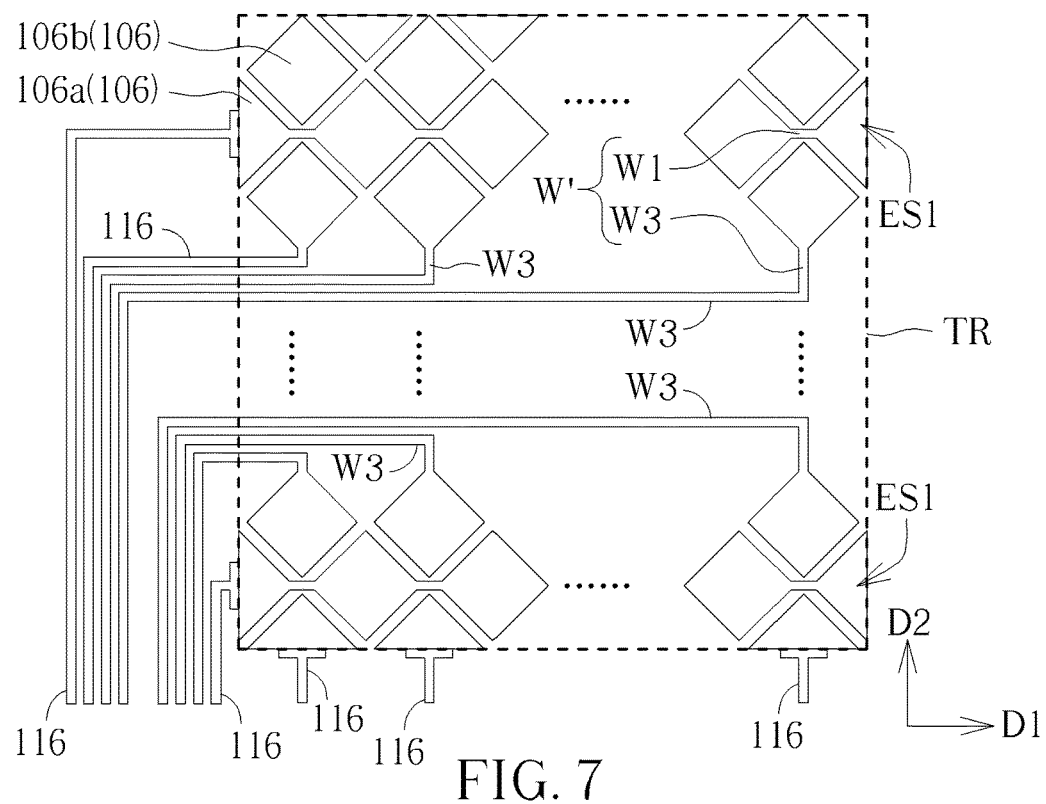
FIG. 7 schematically illustrates a top view of the touch device layer according to a third variant embodiment of the first embodiment of the present disclosure.

In a third variant embodiment, as shown in FIG. 7, the touch electrodes 106 and the wire layer W' in the touch region TR may be formed of single one conductive layer as compared with the first embodiment. Specifically, the wire layer W' doesn't include the second wire, so that two adjacent second touch electrodes 106b are not connected in the touch region TR, but every two adjacent first touch electrodes 106a may still be connected by each first wire W1 to form the first electrode string ES1. In this variant embodiment, besides the first wires W1, the wire layer W' further includes a plurality of third wires W3 spaced apart from each other, and each second touch electrode 106b is electrically connected to one corresponding touch trace 116 through one third wire W3 respectively.

Figure 8:
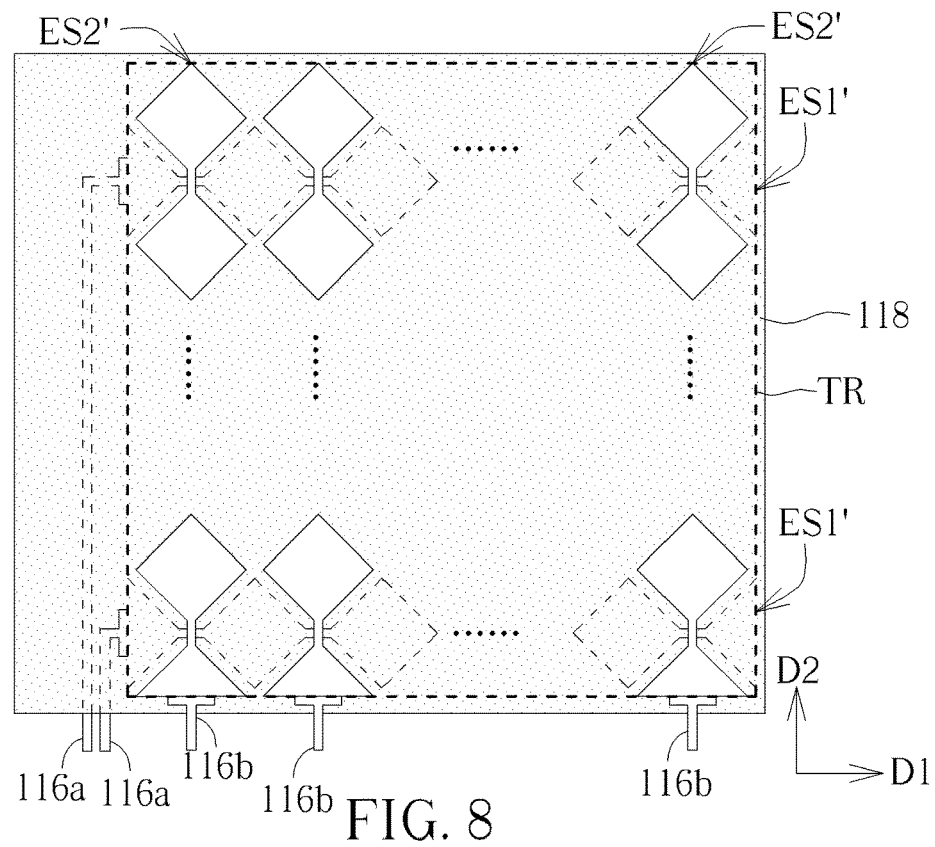
FIG. 8 schematically illustrates a top view of the touch device layer according to a fourth variant embodiment of the first embodiment of the present disclosure.

In a fourth variant embodiment, as shown in FIG. 8, the first electrode strings ES1' and the second electrode strings ES2' are formed of different conductive layers as compared with the first embodiment. In this variant embodiment, the touch device layer may further includes a film 118 disposed between the first electrode strings ES1' and the second electrode strings ES2', so that the first electrode strings ES1' and the second electrode strings ES2' can be insulated from each other. Also, the touch traces 116a connected to the first electrode strings ES1 and the touch traces 116b connected to the second electrode strings ES2 are disposed on two sides of the film 118 respectively. The touch device layer of the present disclosure may be different from the above-mentioned embodiments.

Figure 9:
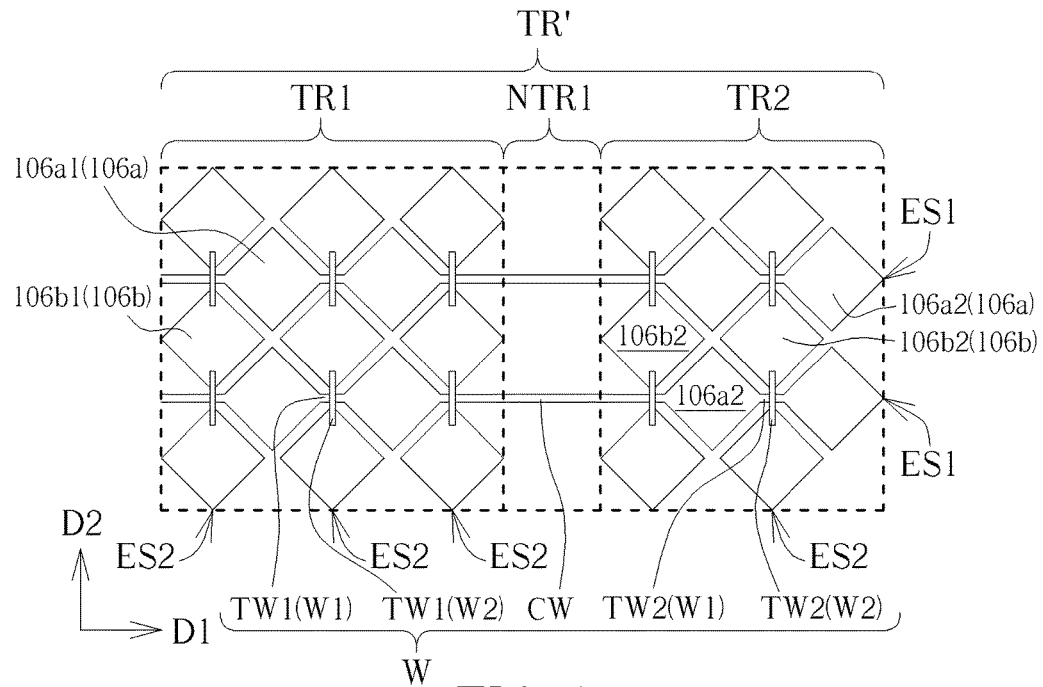
FIG. 9 schematically illustrates a top view of the touch device layer according to a fifth variant embodiment of the first embodiment of the present disclosure.

In a fifth variant embodiment, as shown in FIG. 9, the touch region TR' may include a first touch region TR1, a second touch region TR2 and a non-touch region NTR1. The non-touch region NTR1 is between the first touch region TR1 and the second touch region TR2. A portion of the touch electrodes is disposed in the first touch region TR1, and another portion of the touch electrodes is disposed in the second touch region TR2. Specifically, the non-touch region NTR1 which may extend along the second direction D2 separates the first touch region TR1 from the second touch region TR2. The first touch electrodes 106a may include a plurality of first sub-electrodes 106a1 disposed in the first touch region TR1 and a plurality of second sub-electrodes 106a2 disposed in the second touch region TR2. The second touch electrodes 106b may include a plurality of third sub-electrodes 106b1 disposed in the first touch region TR1 and a plurality of fourth sub-electrodes 106b2 disposed in the second touch region TR2. Since the second electrode strings ES2 formed by the second touch electrodes 106b and the second wires W2 are disposed along the second direction D2, the second electrode strings ES2 do not cross the non-touch region NTR1. The first electrode strings ES1 formed by the first touch electrodes 106a and the first wires W1 are disposed along the first direction D1 so as to cross the non-touch region NTR1. The first wires W1 and the second wires W2 include a plurality of first touch wires TW1 connected to the first sub-electrodes 106a1 and the third sub-electrodes 106b1 (a portion of the touch electrodes in the first touch region TR1) and a plurality of second touch wires TW2 connected to the second sub-electrodes 106a2 and the fourth sub-electrodes 106b2 (another portion of the touch electrodes in the second touch region TR2). The wire layer W may further include a plurality of connecting wires CW disposed in the non-touch region NTR1. Each connecting wire CW is disposed between the first sub-electrodes 106a1 and the second sub-electrodes 106a2 in one first electrode string ES1 and electrically connects them. In this embodiment, the connecting wires CW overlap the non-touch region NTR1 in the vertical direction Z. Also, the non-touch region NTR1 may overlap a part of the light-emitting units 104. In another embodiment, the non-touch region NTR1 may extend along the first direction D1, and accordingly, the second electrode strings ES2 cross the non-touch region NTR1.

Figure 10:
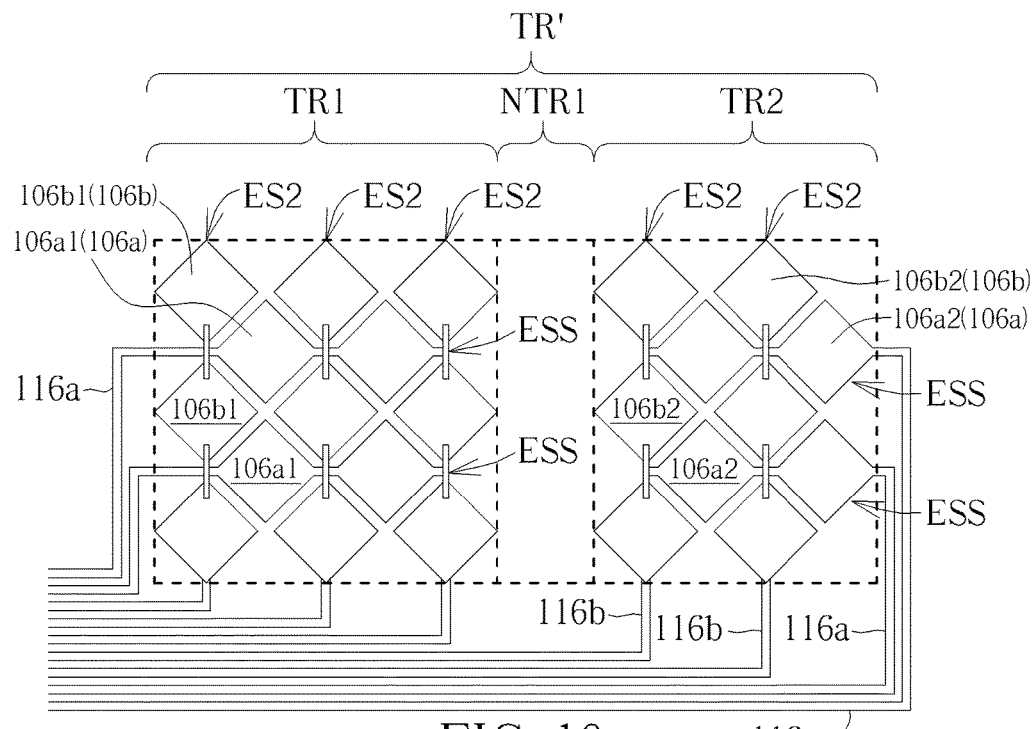
FIG. 10 schematically illustrates a top view of the touch device layer according to a sixth variant embodiment of the first embodiment of the present disclosure.

In a sixth variant embodiment, as shown in FIG. 10, the non-touch region NTR1 may not have connecting wires disposed therein as compared with the fifth variant embodiment. Specifically, each first electrode string is divided into two electrode sub-strings ESS respectively in the first touch region TR1 and the second touch region TR2. Besides each second electrode string ES2 is connected to the corresponding touch trace 116b respectively, each electrode sub-string ESS is also connected to one corresponding touch trace 116a outside the touch region TR' respectively. Thus, there are no touch traces and connecting wires in the non-touch region NTR1.

Figure 11:
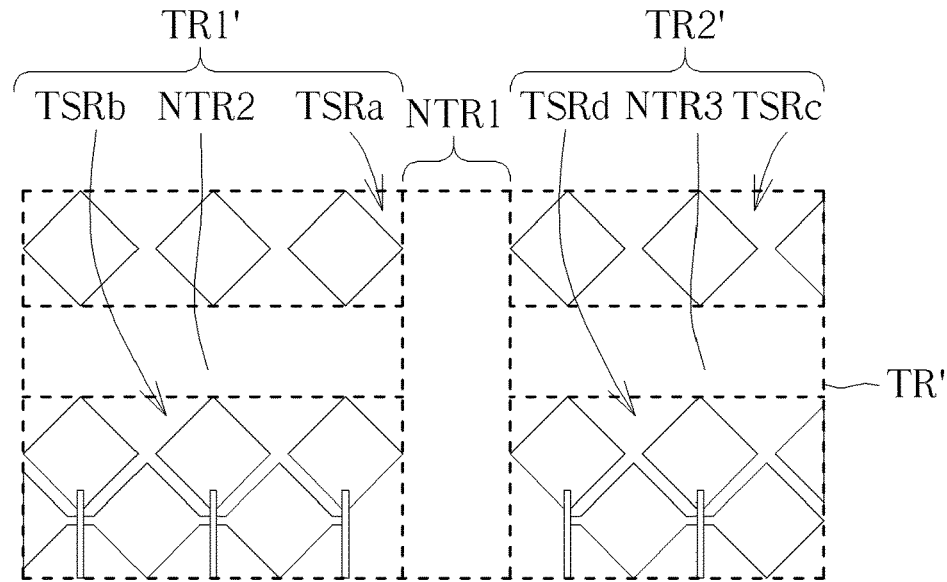
FIG. 11 schematically illustrates a top view of the touch device layer according to a seventh variant embodiment of the first embodiment of the present disclosure.

In a seventh variant embodiment, as shown in FIG. 11, the first touch region TR1' and the second touch region TR2' may be further divided into two separated touch sub-regions TSRa, TSRb, TSRc, TSRd respectively as compared with the fifth variant embodiment. In this variant embodiment, the first touch region TR1' may further include a first touch sub-region TSRa, a second touch sub-region TSRb and another non-touch region NTR2, and the non-touch region NTR2 separates the first touch sub-region TSRa from the second touch sub-region TSRb. The second touch region TR2' may further include a third touch sub-region TSRc, a fourth sub-touch region TSRd and another non-touch region NTR3, and the non-touch region NTR3 separates the third touch sub-region TSRc from the fourth touch sub-region TSRd. The non-touch regions NTR2, NTR3 are connected to the non-touch region NTR1 to form a cross shape, but not limited thereto.

Figure 12:
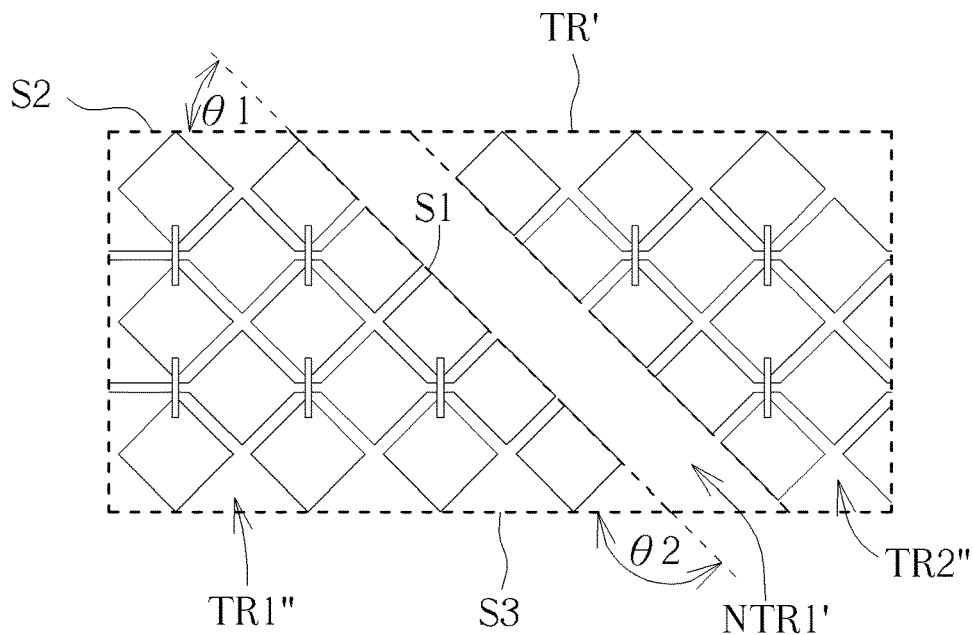
FIG. 12 schematically illustrates a top view of the touch device layer according to an eighth variant embodiment of the first embodiment of the present disclosure.

In an eighth variant embodiment, as shown in FIG. 12, the extension direction of the non-touch region NTR1' may not be perpendicular to the edge of the touch region TR' as compared with the fifth variant embodiment. In this variant embodiment, the first touch region TR1" has a first side S1 facing the second touch region TR2" and a second side S2 connected to the first side S1, and the first side S1 and the second side S2 have a first included angle θ1 less or greater than 90 degrees. Also, the first touch region TR1" may further have a third side S3 opposite to the second side S2 and connected to the first side S1, and the third side S3 and the first side S1 have a second included angle θ2 complementary to the first included angle θ1. The sum of the first included angle θ1 and the second included angle θ2 may be 180 degrees.

Figure 13:
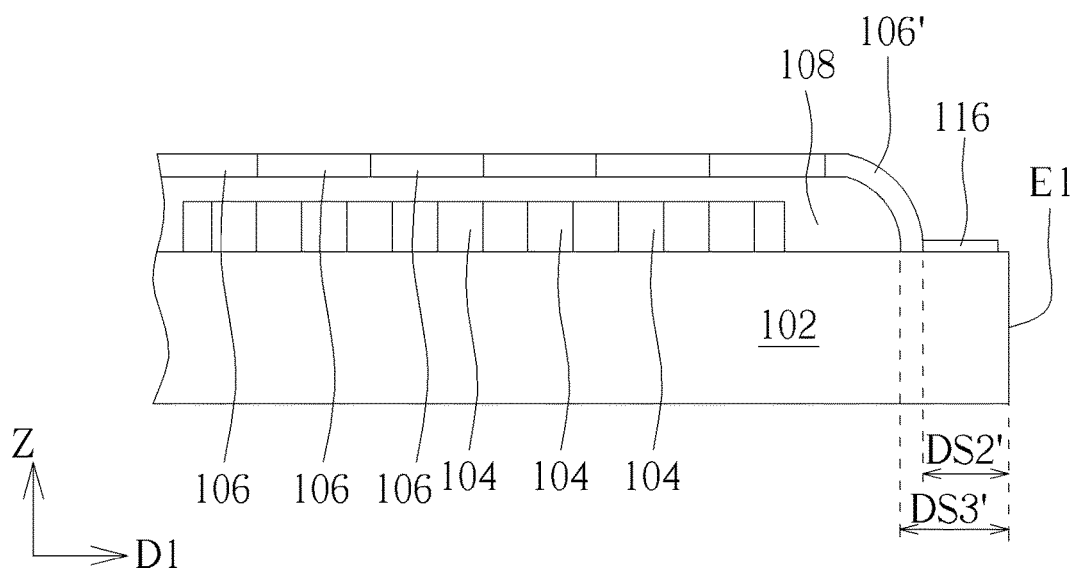
FIG. 13 schematically illustrates a cross-section of a touch display device according to a ninth variant embodiment of the first embodiment of the present disclosure.

In a ninth variant embodiment, as shown in FIG. 13, different from the first embodiment, a part of the touch electrodes 106' of the touch display device 100 provided in this variant embodiment extends from the top surface of the insulation layer 108 onto the top surface of the substrate 102, and so the third distance DS3' may be greater than the second distance DS2'.

Figure 14:
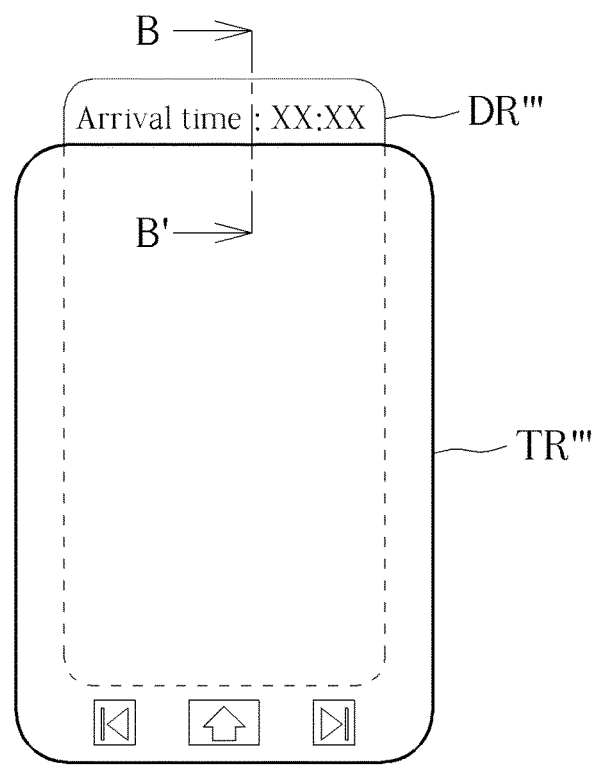
FIG. 14 schematically illustrates a top view of a touch display device according to a tenth variant embodiment of the first embodiment of the present disclosure.
Figure 15:
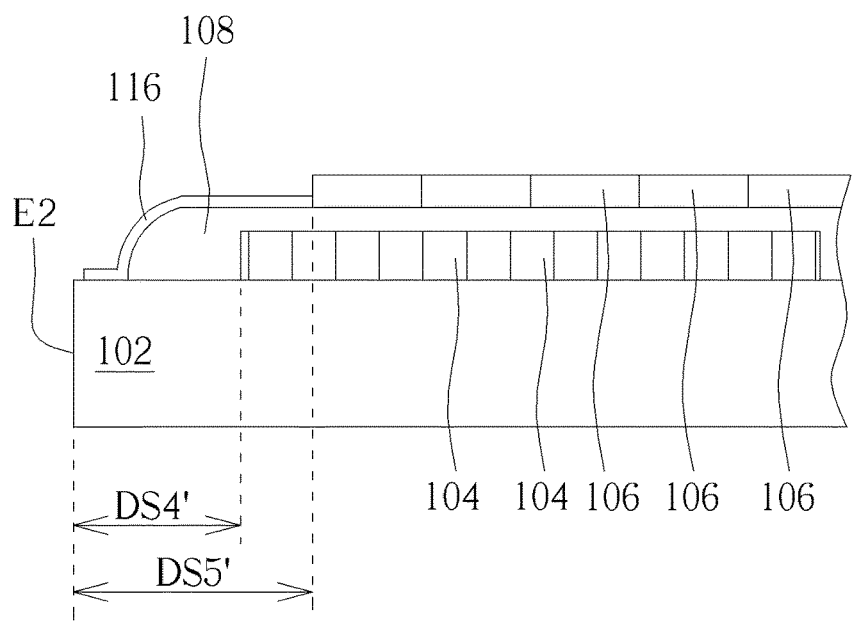
FIG. 15 schematically illustrates a cross-section taken along a cross-sectional line B-B' of FIG. 14.

Refer to FIG. 14 and FIG. 15. FIG. 14 schematically illustrates a top view of a touch display device according to a tenth variant embodiment of the first embodiment of the present disclosure, and FIG. 15 schematically illustrates a cross-section taken along a cross-sectional line B-B' of FIG. 14. Different from the first embodiment, the fourth distance DS4' is less than the fifth distance DS5', so that a part of the display region DR'" is not covered with touch region TR'. The part of the display region DR'" may show information that is not required to be interacted with the user, such as time information.

The touch display device is not limited by the aforementioned embodiment, and may have other different embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 16:
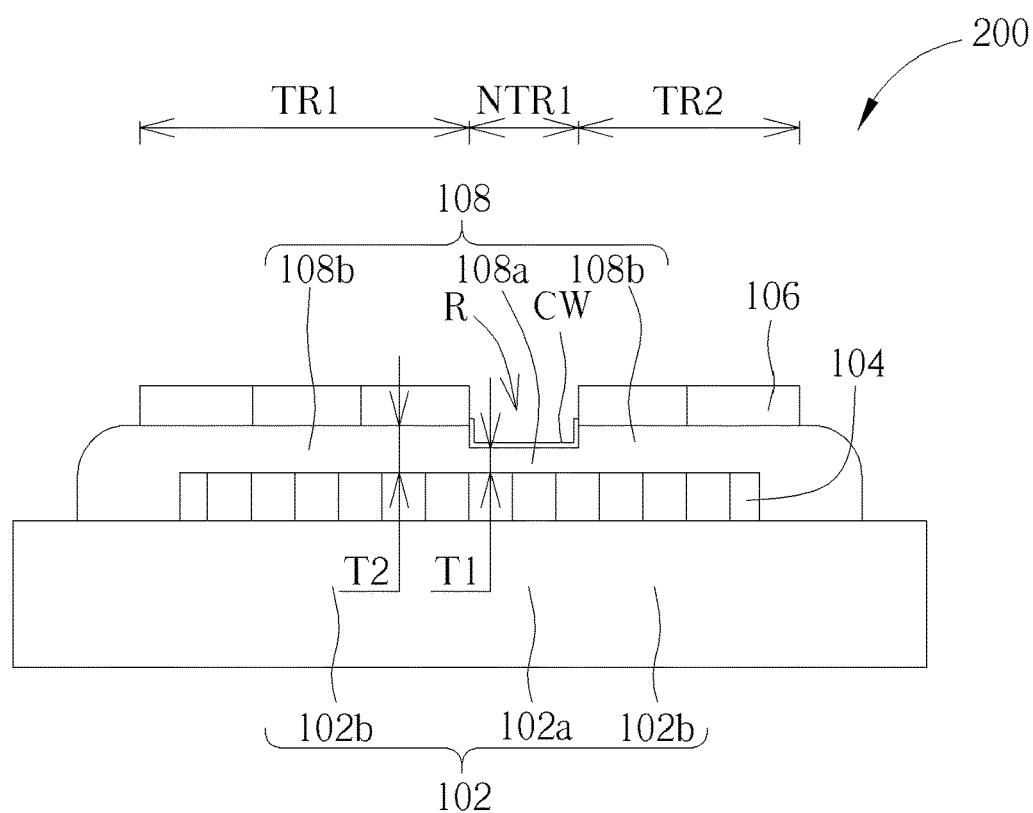
FIG. 16 schematically illustrates a cross-sectional view of a touch display device according to a second embodiment of the present disclosure.

Refer to FIG. 16, which schematically illustrates a top view of a touch display device according to a second embodiment of the present disclosure. In the touch display device 200 of this embodiment, since the touch device layer of this embodiment may be the same as the touch device layer of the fifth variant embodiment of the first embodiment, as shown in FIG. 9, the touch electrodes 106 will not be redundantly described. Different from the first embodiment, the substrate 102 may be flexible so as to have a bent portion 102a and at least one flat portion 102b in this embodiment. The bent portion 102a corresponds to the non-touch region NTR1. Specifically, the substrate 102 has two flat portions 102b separated by the bent portion 102a. The light-emitting units 104 overlap the flat portions 102b and the bent portion 102a. In this embodiment, the insulation layer 108 may include a first portion 108a corresponding to the bent portion 102a and two second portions 108b corresponding to the flat portions 102b respectively. The first portion 108a is disposed between the second portions 108b. The first portion 108a has a maximum thickness which is a first thickness T1, and the second portion 108b has a maximum thickness which is a second thickness T2 greater than or equal to the first thickness T1. In other words, the insulation layer 108 includes a recess corresponding to the first portion 108a. The connecting wire CW may extend into the recess R, so that when the bent portion 102a is bent, the connecting wire CW is not easily broken. In another embodiment, the light-emitting units 104 of the above variant embodiments or the touch electrodes, the wire layer and the touch traces of the above other variant embodiments may be applied to touch display device 200 of the second embodiment.

Figure 17:
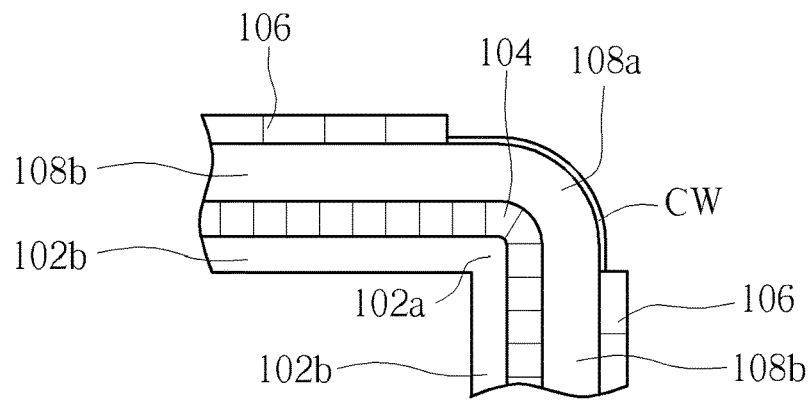
FIG. 17 and FIG. 18 respectively illustrate the bending angle of the touch display device at 90 degrees and 180 degrees according to the second embodiment of the present disclosure.
Figure 18:
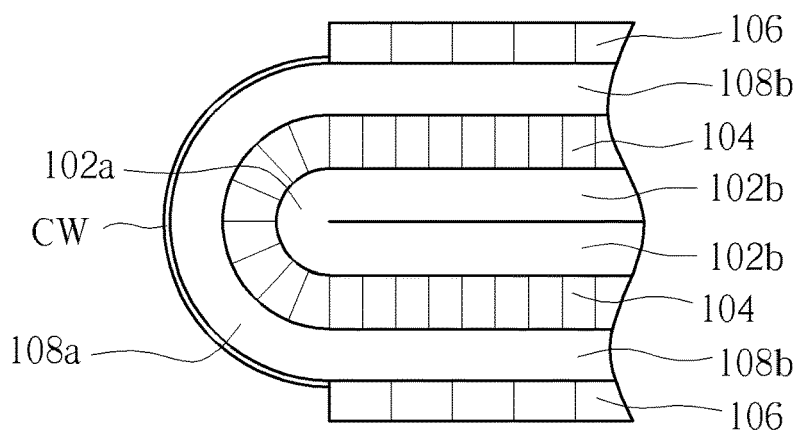

In this embodiment, the substrate 102 can be bent at the bent portion 102a, and the bending angle may be about 90 degrees as shown in FIG. 17 or 180 degrees as shown in FIG. 18. Also, a part of the light-emitting units 104 are bent at the bent portion 102a when the substrate 102 is bent.

Figure 19:
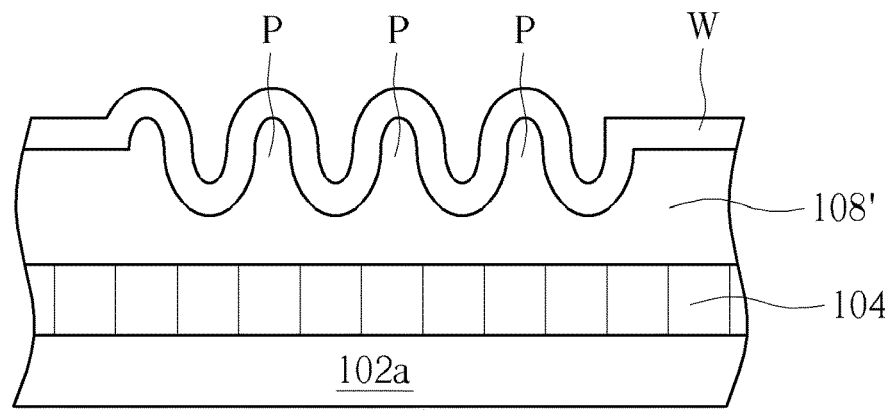
FIG. 19 schematically illustrates a cross-sectional view of a touch display device corresponding to the bent portion according to a variant embodiment of the second embodiment of the present disclosure.

In a variant embodiment of the second embodiment, as shown in FIG. 19, the insulation layer 108' may have a plurality of protrusions P on the bent portion 102a, and the wire layer W is conformally disposed on the protrusions P. Accordingly, the wire layer W may have more stretch ability, and when the bent portion 102a is bent, the wire layer W is not easily broken.

Figure 20A:
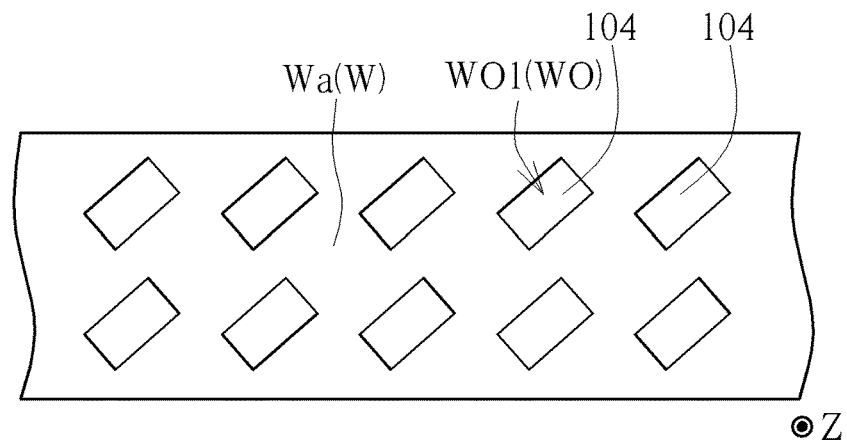
FIG. 20A, FIG. 20B and FIG. 20C respectively illustrate one wire according to other variant embodiments of the second embodiment of the present disclosure.
Figure 20B:
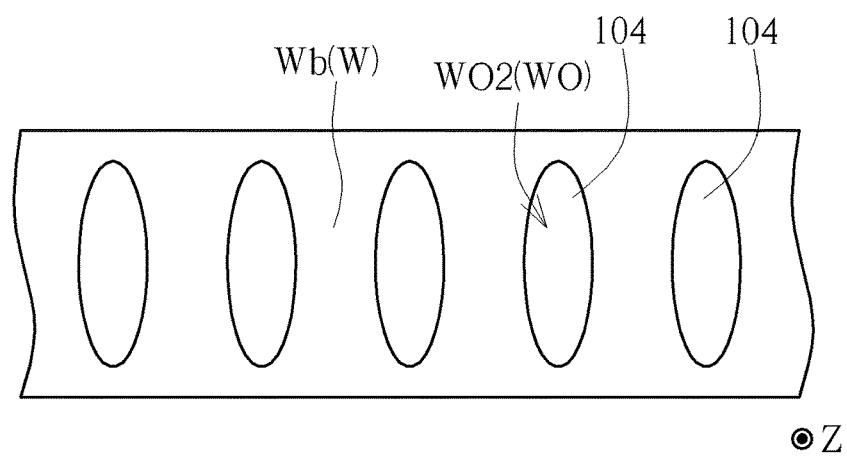
Figure 20C:
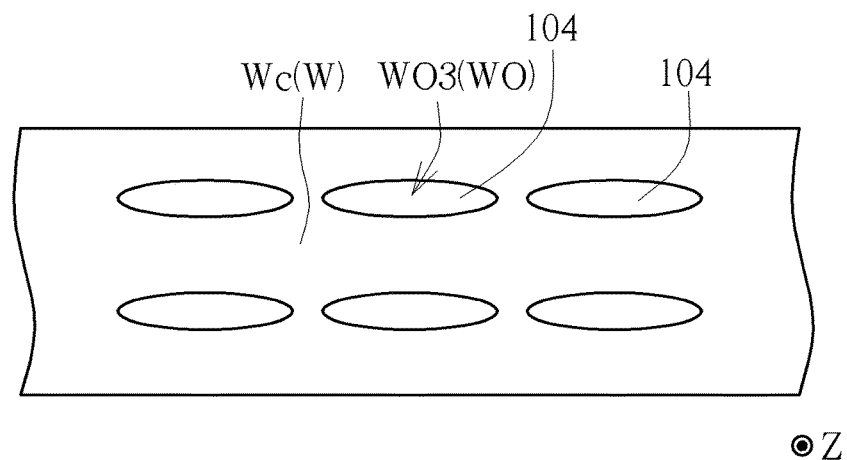

In another variant embodiment of the second embodiment, the wire layer W may not overlap the light-emitting units 104 in the vertical direction Z. Specifically, each wire of the wire layer W may have a plurality of openings WO, and each opening WO may correspond to one of the light-emitting units 104 respectively so as to expose the corresponding light-emitting unit 104 without shielding light from the light-emitting units 104. As shown in FIG. 20A, the shape of each opening WO1 of each wire Wa may be rectangular. As shown in FIG. 20B, the shape of each opening WO2 may be elliptic, and the long axis of each elliptic opening WO2 is perpendicular to the extension direction of the corresponding wire Wb. As shown in FIG. 20C, the shape of each opening WO3 may be elliptic, and the long axis of each elliptic opening WO3 is parallel to the extension direction of the corresponding wire Wc.

Figure 21:
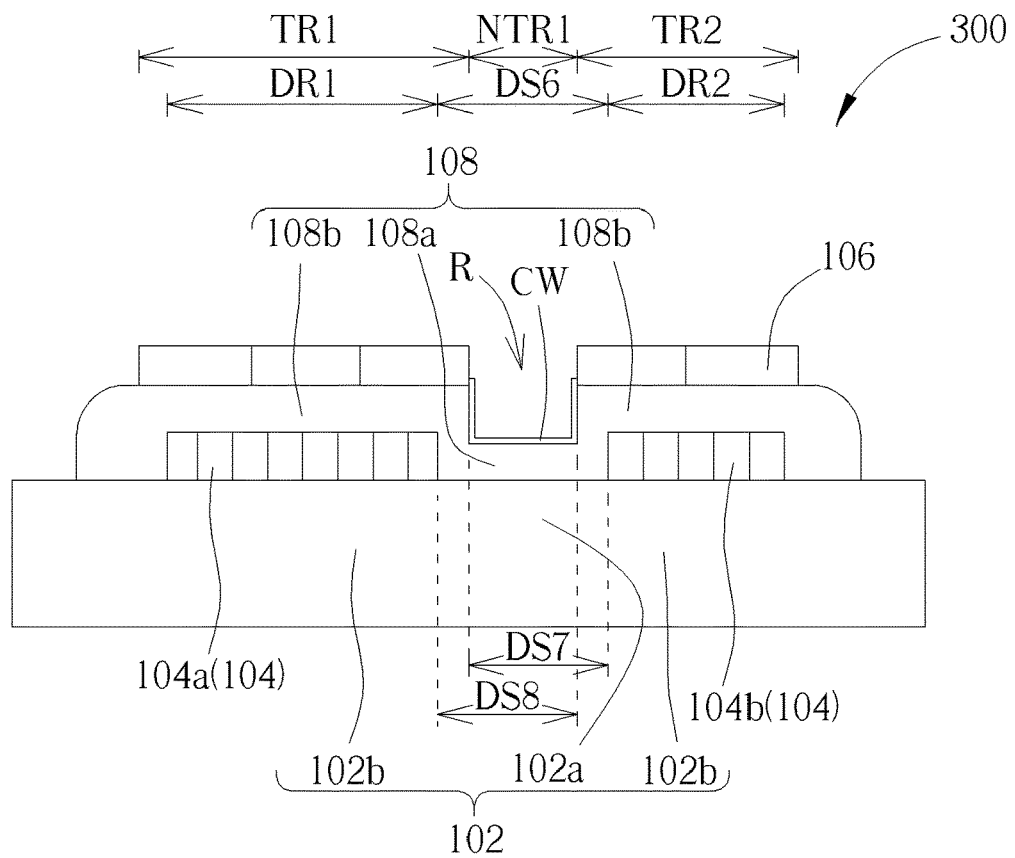
FIG. 21 schematically illustrates a cross-sectional view of a touch display device according to a third embodiment of the present disclosure.

Refer to FIG. 21, which schematically illustrates a cross-sectional view of a touch display device according to a third embodiment of the present disclosure. Different from the second embodiment, the light-emitting units 104 of the touch display device 300 provided in this embodiment do not overlap the bent portion 102a, and includes a plurality of first light-emitting units 104a disposed corresponding to one flat portion 102b and a plurality of second light-emitting units 104b disposed corresponding to the other flat portion 102b. Also, the first light-emitting units 104a may correspond to the first touch region TR1, and the second light-emitting units 104b may correspond to the second touch region TR2. Accordingly, no light-emitting units are bent when the bent portion 102a of the substrate 102 is bent.

In this embodiment, the first light-emitting units 104a may have a first display region DR1, and the second light-emitting units 104b may have a second display region DR2. Since the first display region DR1 and the second display region DR2 may be formed and defined similar to the definition of the display region of the first embodiment, the definitions of the first display region DR1 and the second display region DR2 are not redundantly detailed. Since there are no light-emitting units 101' 104 disposed on the bent portion 102a and the insulation layer 108 is conformally formed on the substrate 102 and the light-emitting units 104, the insulation layer 108 may extend onto the bent portion 102a to form a recess R, and a part of the insulation layer 108 is disposed between the first light-emitting units 104a and the second light-emitting units 104b. The connecting wire CW may extend into the recess R, so that when the bent portion 102a is bent, the connecting wire CW is not easily broken. Also, in order to avoid insensitivity for the touch of the finger at the inner side of the first display region DR1 and at the inner side of the second display region DR2, a minimum distance from the inner side of the first display region DR1 to the inner side of the second display region DR2 that is a sixth distance DS6 is greater than a minimum distance from the inner side of the first touch region TR1 to the inner side of the second display region DR2 parallel to the substrate 102 that is a seventh distance DS7, in which the inner side of the first display region DR1 faces the inner side of the second display region DR2. Similarly, a minimum distance from the inner side of the second display region DR2 to the inner side of the first display region DR1 that is the sixth distance DS6 may also be greater than a minimum distance from the inner side of the second touch region TR2 to the inner side of the first display region DR1 parallel to the substrate 102 that is an eighth distance DS8. In other words, the first touch region TR1 may be greater than the first display region DR1, and/or the second touch region TR2 may be greater than the second display region DR2.

Figure 22:
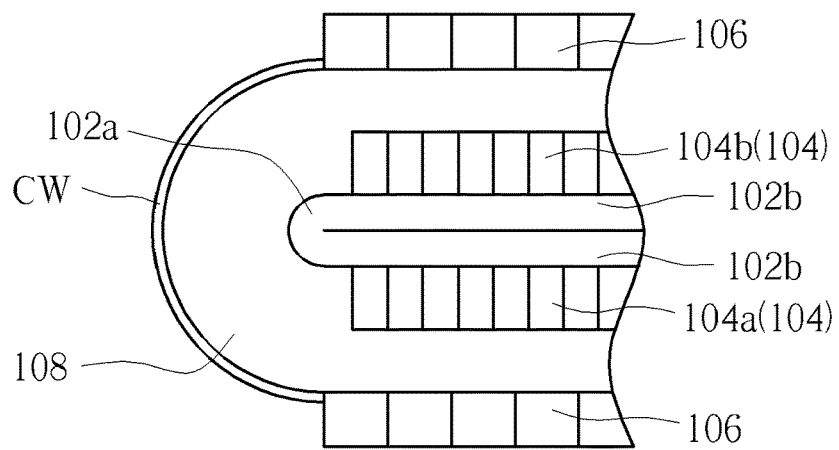
FIG. 22 schematically illustrates the bending angle of the touch display device at 180 degrees according to the third embodiment of the present disclosure.

With reference to FIG. 22, the touch display device 300 can be bent for example about 180 degrees at the bent portion 102a. Since the light-emitting units 101' 104 don't overlap the bent portion 102a, the first light-emitting units 104a and the second light-emitting units 104b are not bent when the touch display device 100 is bent.

In accordance with the embodiments disclosed herein, since a minimum distance from the first edge to the light-emitting units parallel to the substrate is greater than a minimum distance from the first edge to the touch electrodes parallel to the substrate, the insensitivity or the signal delay at the edge of the display region corresponding to the first edge can be mitigated or the touch sensitivity at the edge of the display region can be increased.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A touch display device comprising:
    a substrate comprising a first edge;
    a plurality of light-emitting units disposed on the substrate;
    a plurality of touch electrodes disposed on the light-emitting units;
    an insulation layer disposed between the light-emitting units and the touch electrodes;
    a touch trace; and
    a wire layer electrically connected to the touch electrodes;
    wherein a first distance is a minimum distance from the first edge to the light-emitting units parallel to the substrate, a second distance is a minimum distance from the first edge to the touch electrodes parallel to the substrate, and the first distance is greater than the second distance;
    wherein the touch trace is electrically connected to one of the touch electrodes, and the touch trace contacts the substrate and the insulation layer;
    wherein the insulation layer has a plurality of protrusions, and the wire layer is disposed on the protrusions.

2. The touch display device of claim 1, wherein a third distance is a minimum distance from the first edge to the insulation layer parallel to the substrate, and the third distance is less than the second distance.

3. The touch display device of claim 2, wherein a portion of the insulation layer disposed between the light-emitting units and the touch trace.

4. The touch display device of claim 1, wherein the wire layer does not overlap the light-emitting units in a direction perpendicular to the substrate.

5. The touch display device of claim 1, wherein a third distance is a minimum distance from the first edge to the insulation layer parallel to the substrate, and the third distance is greater than the second distance.

6. The touch display device of claim 1, wherein the substrate further comprises a second edge, a fourth distance is a minimum distance from the second edge to the light-emitting units parallel to the substrate, a fifth distance is a minimum distance from the second edge to the touch electrodes parallel to the substrate, and the fourth distance is less than the fifth distance.

7. The touch display device of claim 1, wherein the light-emitting units have a display region in a direction perpendicular to the substrate, and the touch electrodes have a touch region in the direction perpendicular to the substrate.

8. The touch display device of claim 7, wherein the display region is disposed in the touch region in the direction perpendicular to the substrate.

9. The touch display device of claim 7, wherein the display region has a first area, the touch region has a second area, and the first area is less than the second area.

10. The touch display device of claim 7, wherein the touch region comprises a first touch region, a second touch region and a non-touch region, the non-touch region is between the first touch region and the second touch region, a portion of the touch electrodes is disposed in the first touch region, and another portion of the touch electrodes is disposed in the second touch region.

11. The touch display device of claim 10, wherein the non-touch region separates the first touch region from the second touch region.

12. The touch display device of claim 10, wherein the first touch region has a first side and a second side, the first side faces the second touch region, and the first side and the second side are connected to each other, and wherein the first side and the second side have an included angle less or greater than 90 degrees.

13. The touch display device of claim 10, further comprising a plurality of first touch wires connected to the portion of the touch electrodes in the first touch region and a plurality of second touch wires connected to the another portion of the touch electrodes in the second touch region.

14. The touch display device of claim 10, further comprising a connecting wire overlapping the non-touch region in the direction perpendicular to the substrate.

15. The touch display device of claim 14, wherein the connecting wire electrically connects one of the touch electrodes in the first touch region and one of the touch electrodes in the second touch region.

16. The touch display device of claim 10, wherein the substrate has a bent portion and a flat portion, and the bent portion corresponds to the non-touch region.

17. The touch display device of claim 16, wherein the insulation layer comprises a first portion corresponding to the bent portion and a second portion corresponding to the flat portion, the first portion has a maximum thickness, the maximum thickness of the first portion is a first thickness, the second portion has a maximum thickness, the maximum thickness of the second portion is a second thickness greater than or equal to the first thickness.

18. The touch display device of claim 16, wherein the light-emitting units correspond to the flat portion.

* * * * *